United States Patent
Park et al.

(10) Patent No.: US 7,102,240 B2
(45) Date of Patent: Sep. 5, 2006

(54) EMBEDDED INTEGRATED CIRCUIT PACKAGING STRUCTURE

(75) Inventors: Heung-Woo Park, Seoul (KR); Jong-Hyeong Song, Kyunggi-do (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 157 days.

(21) Appl. No.: 10/945,540

(22) Filed: Sep. 20, 2004

(65) Prior Publication Data

US 2005/0275113 A1 Dec. 15, 2005

(30) Foreign Application Priority Data

Jun. 11, 2004 (KR) .................. 10-2004-0043038

(51) Int. Cl.
*H01L 23/48* (2006.01)

(52) U.S. Cl. ............ 257/778; 361/760; 361/761; 361/785

(58) Field of Classification Search ........... 361/760, 361/761, 785, 791; 257/778
See application file for complete search history.

(56) References Cited

U.S. PATENT DOCUMENTS

| | | | |
|---|---|---|---|
| 5,311,360 A | 5/1994 | Bloom et al. | |
| 6,096,576 A | 8/2000 | Corbin et al. | |
| 6,303,986 B1 | 10/2001 | Shook | |
| 6,396,711 B1* | 5/2002 | Degani et al. | 361/760 |
| 6,452,260 B1 | 9/2002 | Corbin et al. | |

* cited by examiner

*Primary Examiner*—Mai-Huong Tran
(74) *Attorney, Agent, or Firm*—Christensen O'Connor Johnson Kindness PLLC

(57) ABSTRACT

An embedded IC packaging structure is disclosed. The embedded IC packaging structure allows a micro-electromechanical system (MEMS) having a great number of electrodes to be bonded to another semiconductor device, such as a driver IC, using a secondary substrate, thus ensuring an easy bonding process, providing IC devices capable of executing high-speed signal processing, reducing the production costs, and improving the production yield of the IC devices.

11 Claims, 6 Drawing Sheets

EMBEDDED INTEGRATED CIRCUIT PACKAGING STRUCTURE

BACKGROUND OF THE INVENTION

1. Field of the Invention

The present invention relates, in general, to integrated circuit (IC) packaging structures and, more particularly, to an embedded IC packaging structure which allows a micro-electro-mechanical system (MEMS) having a great number of electrodes to be bonded to another semiconductor device, such as a driver IC, using a secondary substrate, thus ensuring an easy bonding process, providing IC devices capable of executing high-speed signal processing, reducing the production costs, and improving the production yield of the IC devices.

2. Description of the Related Art

In the related art, the technical term "bonding" means an electrical connection or a physical connection between elements of semiconductor devices, such as a physical attachment of a chip to a paddle of a lead frame, an electrical wire connection of chip bond pads to inner leads of a lead frame, and a direct mounting of balls of chip bond pads to designated points of a circuit board. Conventional bonding techniques include wire bonding, TAB bonding, flip-chip binding, etc.

Wire bonding means connecting the bond pads of a monolithic chip to the inner leads of a lead frame using Au-wires or Al-wires after die bonding. In a conventional Au-wire bonding, a small diameter Au-wire unwound from an Au-wire spool passes through a capillary tube of tungsten carbide to form an Au-ball at an end of the Au-wire. The Au-ball of the wire is placed on a designated chip bond pad, and thereafter, the capillary tube is pressed downwards to bond the Au-ball to the designated chip bond pad.

In the above case, the chip has been preheated to about 360° C. which is almost equal to the eutectic point of Au—Si, the Au-wire is bonded to the designated chip bond pad by both pressure applied from the capillary tube and heat of the chip while the spherical shape of the Au-ball is deformed into a nail head shape. Such a bonding technique using heat and pressure is called "thermo-compression bonding" in the related art. After the Au-wire is bonded to the designated chip bond pad, the capillary tube is raised upwards, and then, the nail head shape of the Au-ball is deformed into a spherical shape using hydrogen gas flame. Thus, the above-mentioned Au-wire bonding is also called "ball bonding" or "nail head bonding" due to the shape of the bonded end of the Au-wire.

Another example of a conventional wire bonding technique is wedge bonding in which an ultrasonic system coupled to a wedge-shaped capillary tube of tungsten carbide is used. During a conventional wedge bonding process, an end of an Al-wire is placed on a designated chip bond pad, and then, the ultrasonic system causes ultrasonic vibration at the end of the Al-wire while the capillary tube is pressed downwards to compress the end of the Al-wire. Thus, heat is generated due to ultrasonic vibration and thermally bonds the end of the Al-wire to the chip bond pad.

After the end of the Al-wire is bonded to the designated chip bond pad, the wedge-shaped capillary tube moves to a lead frame so as to bond a designated point of the Al-wire to a designated inner lead of the lead frame in the same manner as that described for the bonding to the chip bond pad. After the designated point of the Al-wire is bonded to the lead frame, the Al-wire is cut at an appropriate position to end the wedge bonding process. In wedge bonding, Al-wires are more preferably used than Au-wires because of the material of the chip bond pads, which is Al. As the Al-wires are bonded to the Al-chip bond pads, undesired metal separation does not occur at the bonded junctions of the wires and the chip bond pads. Wedge bonding using the ultrasonic system is also called "ultrasonic bonding" in the related art.

TAB bonding means a bonding technique in which chips having metal balls on their bond pads are precisely arranged on designated positions on a polyimide tape comprising metal lead patterns formed on a polyimide film. After arranging the chips on the polyimide tape, the metal balls of the chips are bonded to the metal lead patterns of the polyimide tape.

After the metal balls of the chips are bonded to the metal lead patterns, a packaging process is executed to package the predetermined regions including the chips and bonded parts of the polyimide tape. After the packaging process, the polyimide tape is cut into pieces to provide semiconductor packages which are then mounted to a PCB (printed circuit board). In the above case, the outer leads of the packages having the polyimide tape are bonded to conductive lines of the PCB.

The polyimide tape used in the TAB bonding has perforations along opposite edges thereof in the same manner as conventional reel films for movies or conventional cassette films for photographs, so that the polyimide tape can be drawn to a desired position during a bonding process. The polyimide tape further has trimming slots with which the tape can be cut into pieces that may be stacked on top of one another during a quality test of the tape or with which the tape can be trimmed to remove unnecessary parts from the tape.

The polyimide tape has rectangular paddles on its inner area to support the chips thereon, with inner lead regions formed by dark portions defined around the paddles. Fine inner leads are arranged close together on each of the inner lead regions. The polyimide tape also has outer lead regions having outer leads which are bonded to the conductive lines of a PCB when the packages are bonded to the PCB. The process of trimming the polyimide tape and removing unnecessary parts outside the outer lead regions provides the packages to be surface-mounted on a PCB.

During a package surface-mounting process, the outer leads of the packages are bonded to the PCB. The polyimide tape further has a bonding array display pattern and a measuring pad to be used for electrical measurement of the tape.

Unlike wire bonding, TAB bonding reduces the volume and weight of packages, greatly increases the possible number of output terminals of the packages, ensures high-speed signal processing of the packages, and increases the process rate during a package production process.

During a conventional bonding process, temperature, pressure and time are recognized as important process variables. A conventional batch bonding technique in which the chip bond pads are grouped for bonding during the same system run may fail to provide constant bonding process results due to a difference in the height of the chip bond pads or due to unevenness of bonding systems, such as capillary tubes. Thus, in recent years, an individual bonding technique in which the chip bond pads are individually bonded is more preferably used.

Flip-chip bonding means a bonding technique in which a metal ball is formed on each of the chip bond pads to be directly bonded to a PCB. The flip-chip bonding technique does not need any wire bonding process, but ensures the recent trend of lightness, thinness, compactness and small size of packages, and furthermore, enhances the degree of integration and operational performance of the packages, unlike other conventional bonding techniques.

The flip-chip bonding technique removes the wire bonding process while allowing the metal bond balls to be evenly arrayed on a designated region of a chip, thus reducing the length of signal paths of circuits and thereby enhancing the frequency characteristics of the circuits. Thus, flip-chip bonding particularly improves the operational performance of a circuit having high frequency characteristics.

Of course, flip-chip bonding must be executed with chips turned upside down during a bonding process, so that the flip-chip bonding may be inconvenient during a bonding process. However, the flip-chip bonding desirably allows a plurality of different kinds of chips to be directly mounted to the same PCB, thus improving the degree of integration and operational performance of semiconductor devices and ensuring the recent trend of lightness, thinness, compactness and small size of semiconductor devices.

In the meantime, the micro-electro-mechanical systems (MEMS), which are well-known silicon semiconductor devices, have been preferably used to fabricate a variety of optical devices, such as tensiometers, accelerometers, electronic level gauges and display devices. The MEMS have ultra-fine actuators, so that the MEMS are greatly sensitive to environmental conditions. In an effort to allow the MEMS to effectively operate without being affected by the environmental conditions, the MEMS have been typically sealed in cavities of sealed packages.

U.S. Pat. No. 6,303,986 discloses "Method and apparatus for sealing a hermetic lid to a semiconductor die". In the US patent, the semiconductor device or the MEMS is a diffraction grating light valve (GLV). An example of conventional GLVs may be referred to U.S. Pat. No. 5,311,360 disclosing "Method and apparatus for modulating a light beam".

FIG. 1 is a sectional view illustrating a conventional semiconductor device in which a lid is hermetically sealed.

As shown in FIG. 1, a conductive ribbon 100 having a metallic conductive/reflective covering 102 is formed over an upper surface of a semiconductor substrate 104, with an air gap 106 defined between the ribbon 100 and the substrate 104. A conductive electrode 108 is formed on the upper surface of the substrate 104 and covered with an insulation layer 110.

The conductive electrode 108 is placed under the ribbon 100 at a position under the air gap 106. The conductive/reflective covering 102 extends beyond the region of the mechanically active ribbon 100 and is configured as a bond pad 112 at its distal end. The semiconductor device is also passivated with a conventional overlying insulating passivation layer 114 which does not cover the bond pads 112 or the ribbon structure 100 and 102. Control and power signals are coupled to the semiconductor device using conventional wire bonding structures 116.

The bond pads 112 are removed from the ribbon structure 100 and 102 to provide a lid sealing region 118. A solderable material 120 is formed onto the lid sealing regions 118 using a conventional semiconductor processing technique. Furthermore, a hermetic lid 122 is joined to the semiconductor device. In the above case, the lid 122 is formed to a size appropriate to fit concurrently over the lid sealing regions 118, with a solderable material 124 formed in a ring surrounding the periphery of one surface of the lid 122. A solder 126 is deposited onto the solderable material 124 so that the lid 122 is joined to the semiconductor device.

In the conventional techniques, the conductive electrodes of a semiconductor device must be electrically connected through a wire bonding process to another semiconductor device which may be a driver IC of a light modulator. However, the electrical connection of the conductive electrodes to the drive IC through the wire bonding process is problematic in that the electrical connection must consume excessive time because the light modulator has a great number of conductive electrodes 201a through 201n as shown in FIG. 2.

The electrical connection of the conductive electrodes of a semiconductor device to a driver IC through the conventional wire bonding process is also problematic in that the electrical connection using the wire bonding reduces the production yield because the closely arranged conductive electrodes 201a through 201n must be carefully wire-bonded to the electrodes of the driver IC as shown in FIG. 2.

The electrical connection of the conductive electrodes of the semiconductor device to the driver IC through the conventional wire bonding process is further problematic in that the electrical connection using wire bonding increases the production costs because the conductive electrodes 201a through 201n must be individually wire-bonded to the electrodes of the drive IC as shown in FIG. 2.

Another problem experienced in the conventional techniques is that the signal processing speed of semiconductor devices is reduced due to inductor components of bond wires when the semiconductor devices are used as high-speed signal processing devices.

In the meantime, the conventional light modulators have been fabricated through TAB bonding processes in which chips having metal balls on bond pads are precisely arranged on designated positions on a polyimide tape having metal lead patterns on a polyimide film. After arranging the chips on the polyimide tape, the metal balls of the chips are bonded to the metal lead patterns of the polyimide tape.

However, the application of the TAB bonding to light modulators undesirably results in high space consumption by the light modulators, thus increasing the production costs of light modulators. Furthermore, the application of the TAB bonding to light modulators undesirably increases the bonding resistance as well as causing the quantity of allowable current to be reduced.

U.S. Pat. No. 6,452,260 discloses "electrical interface to integrated circuit device having high density I/O count" and U.S. Pat. No. 6,096,576 discloses "Method of producing electrical interface to integrated circuit device having high density I/O count". The two US patents proposed applications of flip-chip bonding during IC device production processes in an effort to overcome the problems caused by conventional wire bonding. However, in the above US patents, cables are used to couple integrated circuits (ICs) to an outside control circuit so that the execution of flip-chip bonding is very difficult. Furthermore, due to the cables coupled to the ICs, maintenance or repair of the IC devices is not easy.

In addition, the ICs in each of the above-mentioned IC devices are placed in air so that the heat dissipating function of the IC devices is formed only by the convection of air, resulting in inferior heat dissipation from the IC devices. Furthermore, to couple the ICs to the outside control circuit using the cables, the surface areas of the ICs must be enlarged to increase the production costs of the IC devices. Another problem of the above-mentioned IC devices is that the size of the bond pads must be excessively enlarged to provide substrate support structures.

SUMMARY OF THE INVENTION

Accordingly, the present invention has been made keeping in mind the above problems occurring in the related art, and an object of the present invention is to provide an embedded IC packaging structure which allows a MEMS having a great number of electrodes to be bonded to another semiconductor device, such as a driver IC, using a secondary substrate, thus ensuring an easy bonding process, providing IC devices capable of executing high-speed signal processing, reducing the production costs, and improving the production yield of the IC devices.

In order to achieve the above object, according to one aspect of the present invention, there is provided an embedded IC packaging structure, comprising: an active IC mounted to a support substrate, with an active element sealed in the active IC and a first row of conductive electrodes provided on an outer surface of the active IC to supply drive electricity to the active element; a driver IC mounted to the support substrate at a position spaced apart from the active IC and generating the drive electricity to drive the active element in response to an outside control signal, with a second row of conductive electrodes provided on an outer surface of the driver IC to supply the drive electricity to the active IC; and a secondary substrate provided on opposite sides of a lower surface thereof with a third row of conductive electrodes corresponding to the first row of conductive electrodes and a fourth row of conductive electrodes corresponding to the second row of conductive electrodes, wherein the third row of conductive electrodes is electrically connected to the fourth row of conductive electrodes through an interconnection circuit provided in the secondary substrate, and the third row of conductive electrodes and the fourth row of conductive electrodes are bonded to the first row of conductive electrodes and the second row of conductive electrodes through a flip-chip bonding process, respectively.

According to another aspect of the present invention, there is provided an embedded IC packaging structure, comprising: an active IC mounted to a support substrate, with an active element sealed in the active IC and a first row of conductive electrodes provided on an outer surface of the active IC to supply drive electricity to the active element; a first secondary substrate mounted to the support substrate at a position spaced apart from the active IC such that an upper surface of the first secondary substrate is leveled with an upper surface of the active IC, the first secondary substrate having a second row of conductive electrodes which is provided on a first side of an outer surface of the first secondary substrate to supply the drive electricity to the active IC and a third row of conductive electrodes which is provided on a second side of the outer surface of the first secondary substrate to receive the drive electricity; a driver IC mounted to the first secondary substrate and generating the drive electricity to drive the active element in response to an outside control signal, with a fourth row of conductive electrodes provided on an outer surface of the driver IC and bonded to the third row of conductive electrodes so as to supply the drive electricity to the active IC; and a second secondary substrate provided on opposite sides of a lower surface thereof with a fifth row of conductive electrodes corresponding to the first row of conductive electrodes and a sixth row of conductive electrodes corresponding to the second row of conductive electrodes, wherein the fifth row of conductive electrodes is electrically connected to the sixth row of conductive electrodes through an interconnection circuit provided in the second secondary substrate, and the fifth row of conductive electrodes and the sixth row of conductive electrodes are bonded to the first row of conductive electrodes and the second row of conductive electrodes through a flip-chip bonding process, respectively.

According to a further aspect of the present invention, there is provided an embedded IC packaging structure, comprising: an active IC comprising an active element mounted to a first side of an upper surface of a substrate while being sealed by a sealing member, with a first row of conductive electrodes provided on the first side of the upper surface of the substrate to be exposed outside the sealing member and supply drive electricity to the active element and a second row of conductive electrodes provided on a second side of the upper surface of the substrate to receive a control signal from an outside control circuit; and a driver IC provided on opposite sides of a lower surface thereof with a third row of conductive electrodes and a fourth row of conductive electrodes, wherein the third row of conductive electrodes and the fourth row of conductive electrodes are bonded to the first row of conductive electrodes and the second row of conductive electrodes through a flip-chip bonding process, respectively, and the driver IC generates the drive electricity to drive the active element of the active IC in response to the control signal transmitted from the outside control circuit through both the second row of conductive electrodes and the fourth row of conductive electrodes, and supplies the drive electricity to the active IC through both the third row of conductive electrodes and the first row of conductive electrodes.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
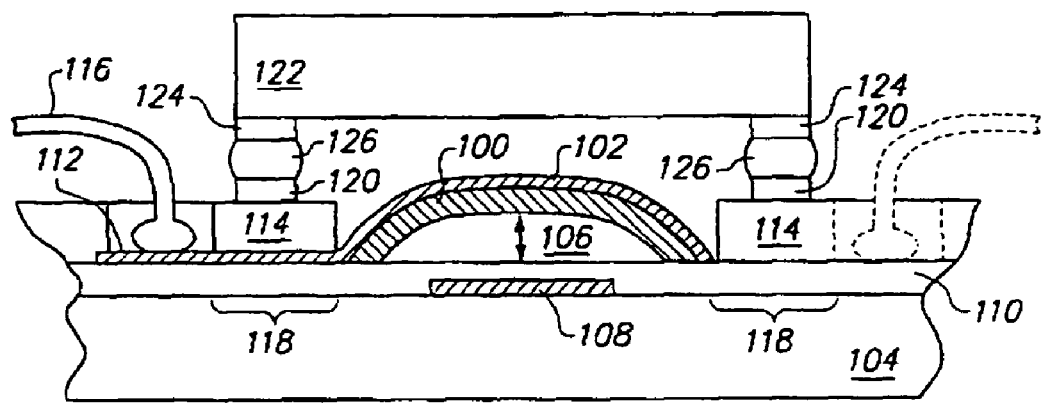
FIG. 1 is a sectional view illustrating a conventional semiconductor device to which a lid is hermetically sealed.
Figure 2:
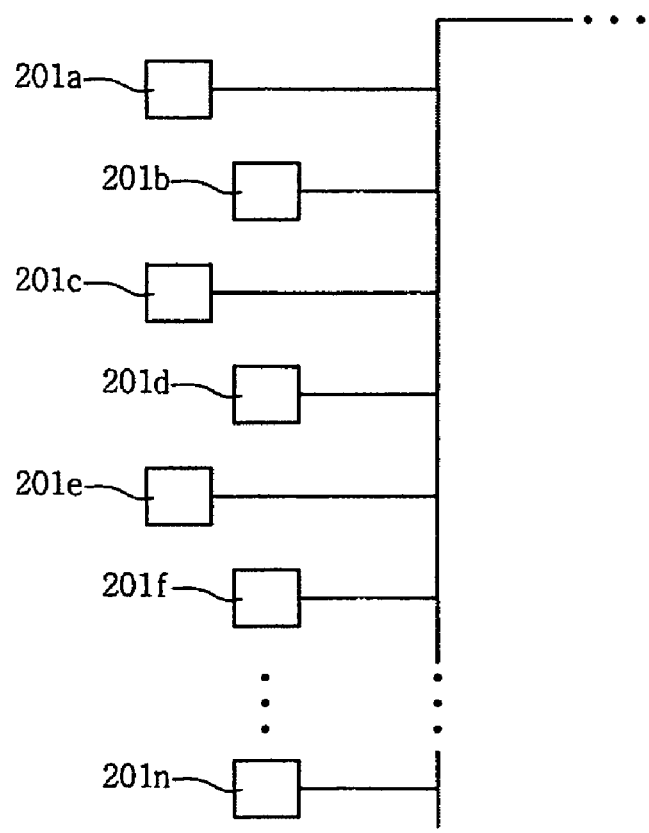
FIG. 2 is a schematic view illustrating an electrode structure of a conventional light modulator.

Reference will now be made in greater detail to preferred embodiments of the invention, examples of which are illustrated in the accompanying drawings, FIGS. 3 through 10c. Wherever possible, the same reference numerals will be used throughout the drawings and the description to refer to the same or like parts.

Figure 3:
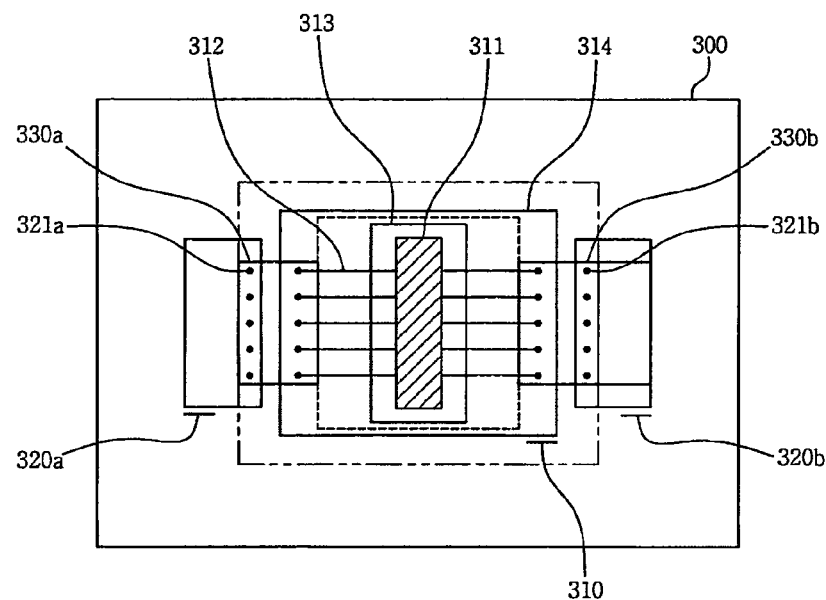
FIG. 3 is a plan view of an embedded IC packaging structure according to a first embodiment of the present invention.
Figure 4:
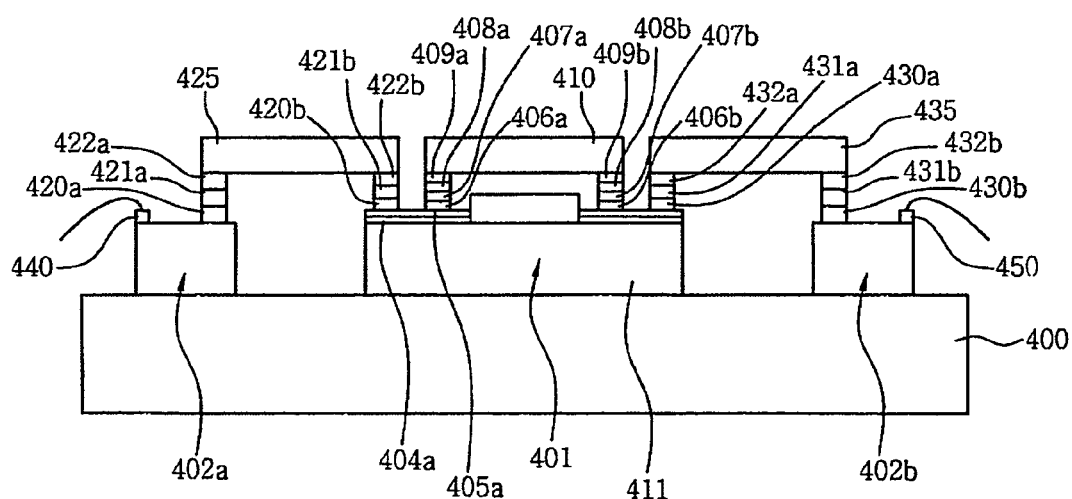
FIG. 4 is a sectional view of an embedded IC packaging structure having an electrical connection between conductive electrodes accomplished by a flip-chip bonding process, according to a modification of the first embodiment of the present invention.

FIG. 3 is a plan view of an embedded IC packaging structure according to a first embodiment of the present invention. FIG. 4 is a sectional view of an embedded IC packaging structure according to a modification of the first embodiment of the present invention.

As shown in FIG. 3, an active IC 310 is mounted to a central portion of an upper surface of a lower substrate 300. In the present invention, the lower substrate 300 may be a silicon substrate, a ceramic substrate or a printed circuit board (PCB).

The active IC 310 may be a diffractive, reflective or transmissive light modulator used in a variety of optical devices, such as optical memories, optical displays, printers, optical interconnections, and hologram displays.

The active IC 310 comprises an element substrate 314; an active element 311 mounted to a central portion of an upper surface of the element substrate 314 and comprising a light modulator ribbon, and vibrating upward and downward when electricity is applied thereto; a plurality of conductive electrodes 312 to supply electricity to the ribbon of the active element 311; and a glass lid 313.

The glass lid 313 covers the active element 311 which is surface-mounted to the element substrate 314, thus protecting the active element 311 from the environment. The glass lid 313 has a light transmissive material at a position corresponding to the active element 311.

A plurality of driver ICs 320a and 320b are mounted to the upper surface of the lower substrate 300 to surround the active IC 310, and supply electricity to the active IC 310 in response to a control signal transmitted thereto from an outside control circuit. In the preferred embodiments, the semiconductor devices bonded to the active IC 310 are the driver ICs 320a and 320b. However, it should be understood that the semiconductor devices bonded to the active IC 310 may be another type of device without being limited to the driver ICs.

The electrical connection of the active IC 310 to the driver ICs 320a and 320b is accomplished by connecting a plurality of conductive electrodes 312 formed on the upper surface of the active IC 310 to a plurality of conductive electrodes 321a, 321b formed on an upper surface of each driver IC 320a, 320b using a secondary substrate 330a, 330b.

Each of the secondary substrates 330a and 330b is provided on an outside edge thereof with a plurality of outside bond pads (see FIG. 5) formed in a zigzag pattern to be bonded to the conductive electrodes 321a, 321b of an associated driver IC 320a, 320b. On an inside edge of each of the secondary substrates 330a and 330b, a plurality of inside bond pads (see FIG. 5) is formed in a zigzag pattern to be bonded to the conductive electrodes 312 of the active IC 310.

In the interior of each of the secondary substrates 330a and 330b, an interconnection circuit is provided to connect the outside bond pads which are bonded to the conductive electrodes 321a, 321b of an associated driver IC 320a, 320b to the inside bond pads which are bonded to the conductive electrodes 312 of the active IC 310. Thus, when the flip-chip bonding of the active IC 310 to the driver ICs 320a and 320b is finished, an electrical path is formed between the active IC 310 and the driver ICs 320a and 320b. In that case, an insulating layer may be formed under the interconnection circuit of each secondary substrate 330a, 330b. In other words, the interconnection circuit of each secondary substrate 330a, 330b may be covered with the insulating layer to be protected from the outside or exposed to the outside without being covered.

In a brief description, the electrical connection of the conductive electrodes 312 of the active IC 310 to the conductive electrodes 321a and 321b of the driver ICs 320a and 320b is accomplished using the secondary substrates 330a and 330b.

In the present invention, the bond pads of the secondary substrates 330a and 330b may comprise thick metal layers, thick metal alloy layers, bumps or solders. When Au is used to provide the bond pads having a thickness of several tens of micrometers, it is possible to compensate for a height difference between the active IC 310 and the driver ICs 320a and 320b using the ductility of Au.

When the active IC 310 is bonded to the driver ICs 320a and 320b using the secondary substrates 330a and 330b as described above, the secondary substrates 330a and 330b may be sequentially or simultaneously bonded.

In the first embodiment of the present invention, each of the secondary substrates 330a and 330b may comprise a junction substrate of silicon substrate-silicon substrate, a junction substrate of silicon substrate-glass substrate, or a ceramic substrate.

Furthermore, a packing material, such as silicon or epoxy, may be packed in gaps between the active IC 310 and the driver ICs 320a and 320b under the secondary substrates 330a and 330b, thus fixing the active IC 310 and the driver ICs 320a and 320b in their places.

As shown by the dotted line in FIG. 3, an integrated secondary substrate may be used in place of the separate secondary substrates 320a and 320b without affecting the function of the present invention. In that case, a cavity must be provided to expose the active element 311 of the active IC 310 to the outside.

In the present invention, the electrical connection of the active IC 310 to the driver ICs 320a and 320b using the secondary substrates 330a and 330b may be accomplished through a flip-chip bonding process.

Herein below, the electrical connection of the active IC to the driver ICs using the secondary substrates and the flip-chip bonding technique will be described with reference to FIG. 4.

As shown in FIG. 4, an active IC 401 is mounted to a central portion of an upper surface of a lower substrate 400. In the same manner as that described above for the embedded IC packaging structure of FIG. 3, the active IC 401 may be a diffractive, reflective or transmissive light modulator used in a variety of optical devices, such as optical memories, optical displays, printers, optical interconnections, and hologram displays.

A plurality of driver ICs 402a and 402b is mounted to the upper surface of the lower substrate 400 to surround the active IC 401.

The active IC 401 comprises an active element 403; lower insulating layers 404a and 404b; conductive electrodes 405a and 405b; upper insulating layers 406a and 406b; lower sealing metal layers 407a and 407b; sealing solders 408a and 408b; upper sealing metal layers 409a and 409b, a glass lid 410, and an element substrate 411. The active element 403 is mounted to a central portion of an upper surface of the element substrate 411, while the lower insulating layers 404a and 404b are formed on the upper surface of the element substrate 411 at portions outside the region of the active element 403 so that the active element 403 is electrically insulated from the surroundings.

In a detailed description, the lower insulating layers 404a and 404b provided on the upper surface of the element substrate 411 are protective layers made of an insulating material, such as $SiO_2$ or $Si_3N_4$, so that the lower insulating layers 404a and 404b protect the element substrate 411 from damage during continued processes and prevent an interelectrode short circuit of the active element 403 provided on the element substrate 411.

The conductive electrodes 405a and 405b are formed on the lower insulating layers 404a and 404b of the element substrate 411 to supply electricity to the active element 403. The conductive electrodes 405a and 405b comprise thin film electrodes.

The upper insulating layers 406a and 406b are formed on the conductive electrodes 405a and 405b such that the upper insulating layers 406a and 406b surround the active element 403 while extending over the electrodes 405a and 405b. Thus, the upper insulating layers 406a and 406b insulate the conductive electrodes 405a and 405b from the lower sealing metal layers 407a and 407b.

The lower sealing metal layers 407a and 407b are formed on the upper insulating layers 406a and 406b to bond the glass lid 410 to the active IC 401 through a flip-chip bonding process. The sealing solders 408a and 408b are formed on the lower sealing metal layers 407a and 407b.

In a detailed description, the lower sealing metal layers 407a and 407b are provided to bond the glass lid 410 serving as a sealing lid to the active IC 401 so that the active element 403 mounted to the surface of the element substrate 411 is protected from environmental water and dust by the glass lid 410. The lower sealing metal layers 407a and 407b are formed on the upper insulating layers 406a and 406b through a conductive metal sputtering or evaporation process.

The glass lid 410 is provided with the upper sealing metal layers 409a and 409b along opposite sides thereof and is bonded to the lower sealing metal layers 407a and 407b by means of the sealing solders 408a and 408b, so that the glass lid 410 protects the active element 403 from the environment.

Figure 5:
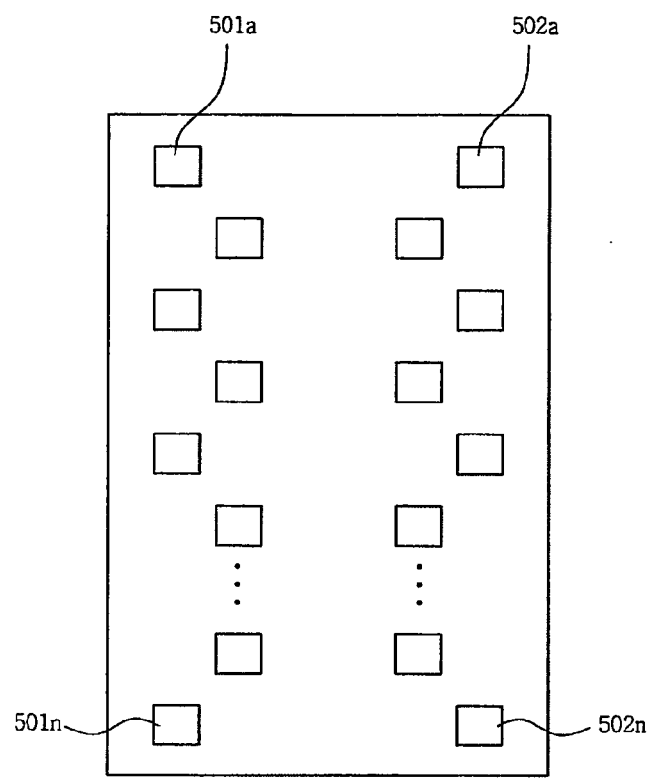
FIG. 5 is a bottom view of a secondary substrate included in the embedded IC packaging structure of FIG. 4.

In the meantime, each secondary substrate 425, 435 used for electrical connection of the active IC to the driver ICs according to the present invention is provided with a plurality of bond pads 501a through 501n, 502a through 502n which are arrayed along opposite sides of the secondary substrate 425, 435 in a zigzag pattern as shown in a bottom view of FIG. 5. Of course, the bond pads 501a through 501n, 502a through 502n may be arrayed in a linear pattern or another pattern in place of the zigzag pattern.

Lower bond pads 420b and 430a are formed on opposite terminal ends of the conductive electrodes 405a and 405b of the active IC 401 so that the bond pads 501a through 501n, 502a through 502n, 422b and 432b of the plurality of secondary substrates 425 and 435 are bonded to the conductive electrodes 405a and 405b. In such a case, the inside bond pads 422b and 432a of the secondary substrates 425 and 435 are bonded to the lower bond pads 420b and 430a of the conductive electrodes 405a and 405b of the active IC 401 through a thermo-compression bonding process, with solder bonds 421b and 431a interposed between the inside bond pads 422b and 432a of the secondary substrates 425 and 435 and the lower bond pads 420b and 430a of the active IC 401.

Each of the driver ICs 402a and 402b is provided with conductive electrodes 420a, 430b on an inside edge of an upper surface thereof to be electrically connected to the conductive electrodes 405a and 405b of the active IC 401.

In such a case, the outside bond pads 422a and 432b of the secondary substrates 425 and 435 are bonded to the conductive electrodes 420a and 430b of the driver ICs 402a and 402b through a thermo-compression bonding process, with solder bonds 421a and 431b interposed between the outside bond pads 422a and 432b of the secondary substrates 425 and 435 and the conductive electrodes 420a and 430b of the driver ICs 402a and 402b.

In the interior of each of the secondary substrates 425 and 435, an interconnection circuit is provided to electrically connect the inside bond pads 422b, 432a to the outside bond pads 422a, 432b.

Furthermore, each of the secondary substrates 425 and 435 may comprise a junction substrate of silicon substrate-silicon substrate, a junction substrate of silicon substrate-glass substrate, or a ceramic substrate.

In addition, the bond pads 422a, 422b, 420a and 430b may comprise thick metal layers, thick metal alloy layers, bumps or solders. When Au is used to provide the bond pads having a thickness of several tens of micrometers, it is possible to compensate for a height difference between the active IC and the driver ICs using the ductility of Au.

In the meantime, each of the driver ICs 402a and 402b is provided with bond pads 440, 450 on an outside edge of the upper surface thereof to be electrically connected to an outside control circuit through a wire bonding process so that the driver ICs 402a and 402b transceive signals with the outside control circuit. As the driver ICs 402a and 402b of the present invention are electrically connected to the outside control circuit through the wire bonding process using the bond pads 440 and 450, the embedded IC packaging structure of the present invention overcomes the problem caused by the conventional electrical connection of the driver ICs to the outside control circuit using cables.

Figure 6:
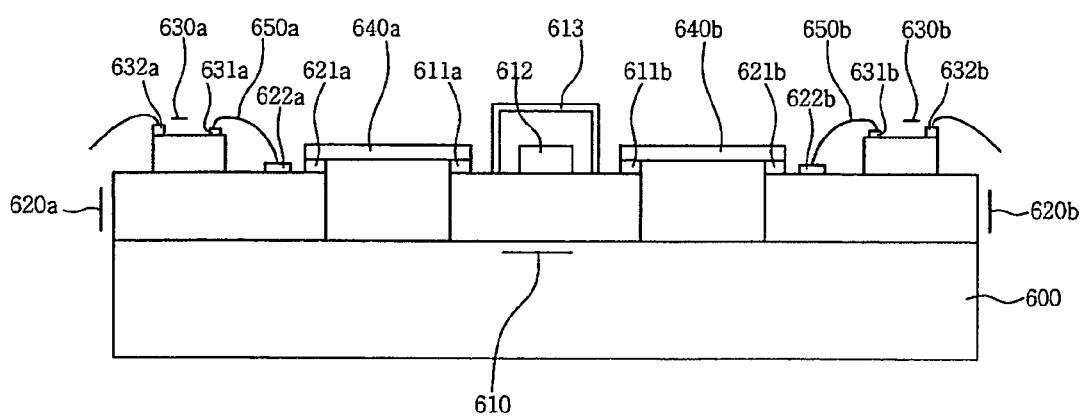
FIG. 6 is a sectional view of an embedded IC packaging structure according to a second embodiment of the present invention.

FIG. 6 is a sectional view of an embedded IC packaging structure according to a second embodiment of the present invention. In the second embodiment, lower support substrates are provided so that the active IC is electrically connected to the lower support substrates through a flip-chip bonding process, while the driver ICs are electrically connected to the lower support substrates through a wire bonding process, unlike the first embodiment.

As shown in FIG. 6, in the embedded IC packaging structure according to the second embodiment, an active IC 610 is mounted to a central portion of an upper surface of a lower substrate 600, with lower support substrates 620a and 620b provided on the lower substrate 600 to support driver ICs 630a and 630b thereon.

The lower support substrates 620a and 620b may comprise silicon, ceramic, PCB, glass or other inexpensive materials. Furthermore, the lower support substrates 620a and 620b may be designed as an integral structure. In that case, it is necessary to provide a cavity at the center of the integral lower support substrate to seat the active IC 610 in the cavity.

The inside edges of the upper surfaces of the lower support substrates 620a and 620b are provided with conductive electrodes 621a and 621b to be electrically connected to the conductive electrodes 611a and 611b of the active IC 610. In that case, the electrical connection of the conductive electrodes 621a and 621b of the lower support substrates 620a and 620b to the conductive electrodes 611a and 611b of the active IC 610 is accomplished through a flip-chip bonding process using secondary substrates 640a and 640b.

Each of the secondary substrates 640a and 640b is provided on opposite edges thereof with a plurality of conductive electrodes formed in a zigzag pattern as shown in FIG. 5, with an interconnection circuit provided in the interior of each of the secondary substrates to electrically connect the conductive electrodes to each other. Of course, the conductive electrodes of the secondary substrates may be arrayed in a linear pattern or another pattern in place of the zigzag pattern.

The inside conductive electrodes of the secondary substrates 640a and 640b are placed on and thermo-compressed to the conductive electrodes 611a and 611b of the active IC 610 with solder bonds interposed between them. Thus, the secondary substrates 640a and 640b are bonded to the active IC 610, so that an electrical path is provided between them.

In the same manner, the outside conductive electrodes of the secondary substrates 640a and 640b are placed on and thermo-compressed to the conductive electrodes 621a and 621b of the lower support substrates 620a and 620b with solder bonds interposed between them. Thus, the secondary substrates 640a and 640b are bonded to the lower support substrates 620a and 620b, so that an electrical path is provided between them.

The driver ICs 630a and 630b having conductive electrodes 631a and 631b on their upper surfaces are mounted to the upper surfaces of the lower support substrates 620a and 620b.

Furthermore, the lower support substrates 620a and 620b have bond pads 622a and 622b on the upper surfaces thereof to be wire-bonded to the driver ICs 630a and 630b.

Thus, when the bond pads 622a and 622b of the lower support substrates 620a and 620b are electrically connected to the conductive electrodes 631a and 631b of the driver ICs 630a and 630b through a wire bonding process, the active element 612 of the active IC 610 is electrically connected to the driver ICs 630a and 630b.

The driver ICs 630a and 630b supply electricity to the active element 612 in response to a control signal transmitted thereto from an outside control circuit so that the active element 612 vibrates upwards and downwards.

In the meantime, each of the driver ICs 630a and 630b is provided with bond pads 632a, 632b on an outside edge of the upper surface thereof to be electrically connected to the outside control circuit through a wire bonding process so that the driver ICs 630a and 630b transceive signals with the outside control circuit. As the driver ICs 630a and 630b are electrically connected to the outside control circuit through the wire bonding process using the bond pads 632a and 632b, the embedded IC packaging structure of the second embodiment overcomes the problem caused by the conventional electrical connection of the driver ICs to the outside control circuit using cables.

Figure 7:
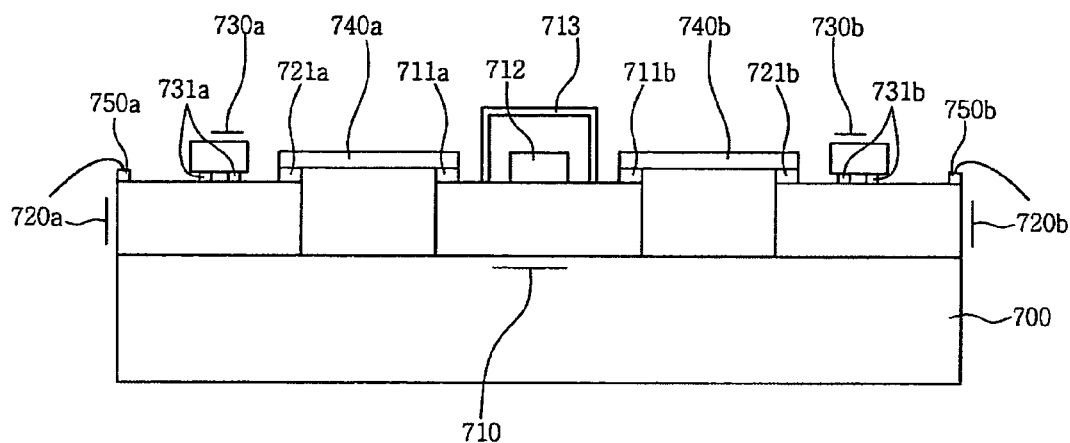
FIG. 7 is a sectional view of an embedded IC packaging structure according to a third embodiment of the present invention.

FIG. 7 is a sectional view of an embedded IC packaging structure according to a third embodiment of the present invention. In the third embodiment, the general shape of the embedded IC packaging structure remains the same as the second embodiment, but the driver ICs are electrically connected to the lower support substrates through a flip-chip bonding process, unlike the second embodiment. The parts of the third embodiment which are common with those of the second embodiment are specified by "700" series numerals and further explanation for the parts is omitted from the following description.

As shown in FIG. 7, in the embedded IC packaging structure according to the third embodiment, an active IC 710 is mounted to a central portion of an upper surface of a lower substrate 700, with lower support substrates 720a and 720b provided on the lower substrate 700 to support driver ICs 730a and 730b thereon.

The lower support substrates 720a and 720b may comprise silicon, ceramic, PCB, glass or other inexpensive materials. Furthermore, the lower support substrates 720a and 720b may be designed as an integral structure. In that case, it is necessary to provide a cavity at the center of the integral lower support substrate to seat the active IC 710 in the cavity.

The inside edges of the upper surfaces of the lower support substrates 720a and 720b are provided with conductive electrodes 721a and 721b to be electrically connected to the conductive electrodes 711a and 711b of the active IC 710. In that case, the electrical connection of the conductive electrodes 721a and 721b of the lower support substrates 720a and 720b to the conductive electrodes 711a and 711b of the active IC 710 is accomplished through a flip-chip bonding process using secondary substrates 740a and 740b.

Each of the secondary substrates 740a and 740b is provided on opposite edges thereof with a plurality of conductive electrodes formed in a zigzag pattern as shown in FIG. 5, with an interconnection circuit provided in each of the secondary substrates to electrically connect the conductive electrodes to each other. Of course, the conductive electrodes of the secondary substrates may be arrayed in a linear pattern or another pattern in place of the zigzag pattern.

The inside conductive electrodes of the secondary substrates 740a and 740b are placed on and thermo-compressed to the conductive electrodes 711a and 711b of the active IC 710 with solder bonds interposed between them. Thus, the secondary substrates 740a and 740b are bonded to the active IC 710, so that an electrical path is provided between them.

In the same manner, the outside conductive electrodes of the secondary substrates 740a and 740b are placed on and thermo-compressed to the conductive electrodes 721a and 721b of the lower support substrates 720a and 720b with solder bonds interposed between them. Thus, the secondary substrates 740a and 740b are bonded to the lower support substrates 720a and 720b, so that an electrical path is provided between them.

The driver ICs 730a and 730b are mounted to the upper surfaces of the lower support substrates 720a and 720b through a flip-chip bonding process.

Thus, the active element 712 of the active IC 710 is electrically connected to the driver ICs 730a and 730b.

The driver ICs 730a and 730b supply electricity to the active element 712 in response to a control signal transmitted thereto from an outside control circuit so that the active element 72 vibrates upwards and downwards.

In the third embodiment, no packing material is packed in the gaps between active IC and the driver ICs. However, it is preferred to pack a packing material, such as epoxy, in the gaps to fix the active IC and the driver ICs in their places.

Figure 8:
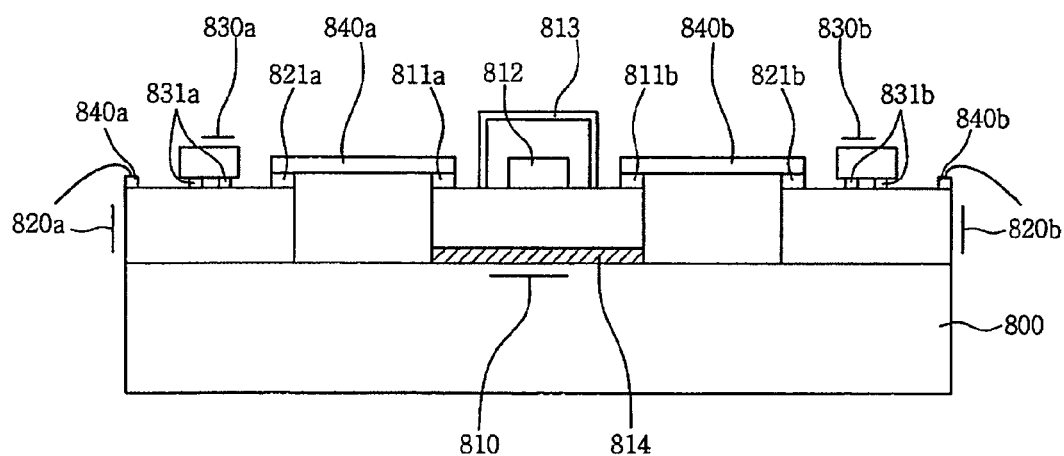
FIG. 8 is a sectional view of an embedded IC packaging structure according to a fourth embodiment of the present invention.

FIG. 8 is a sectional view of an embedded IC packaging structure according to a fourth embodiment of the present invention. In the fourth embodiment, the general shape of the embedded IC packaging structure remains the same as the third embodiment, but a soft metal layer 814 is provided under the active IC 810 to make the IC device flat, unlike the third embodiment. The parts of the fourth embodiment which are common with those of the third embodiment are specified by "800" series numerals and further explanation for the parts is omitted from the following description.

In the fourth embodiment, the soft metal layer 814 may be formed of, for example, Au so that the soft metal layer 814 elastically moves in response to outside pressure. Thus, the soft metal layer 814 cushions the active IC 810.

In the second through fourth embodiments, an interconnection circuit is provided in each of the secondary substrates to electrically connect the conductive electrodes of the packaging structure to each other. However, the electrical connection between the conductive electrodes in the packaging structure may be accomplished by the driver ICs without using any separate secondary substrate.

In that case, the outside edge of the lower surface of each of the driver ICs is bonded to the conductive electrodes of an associated lower support substrate, while the inside edge of the lower surface of each driver IC is bonded to the conductive electrodes of the active IC, thus accomplishing the electrical connection between the conductive electrodes.

Figure 9:
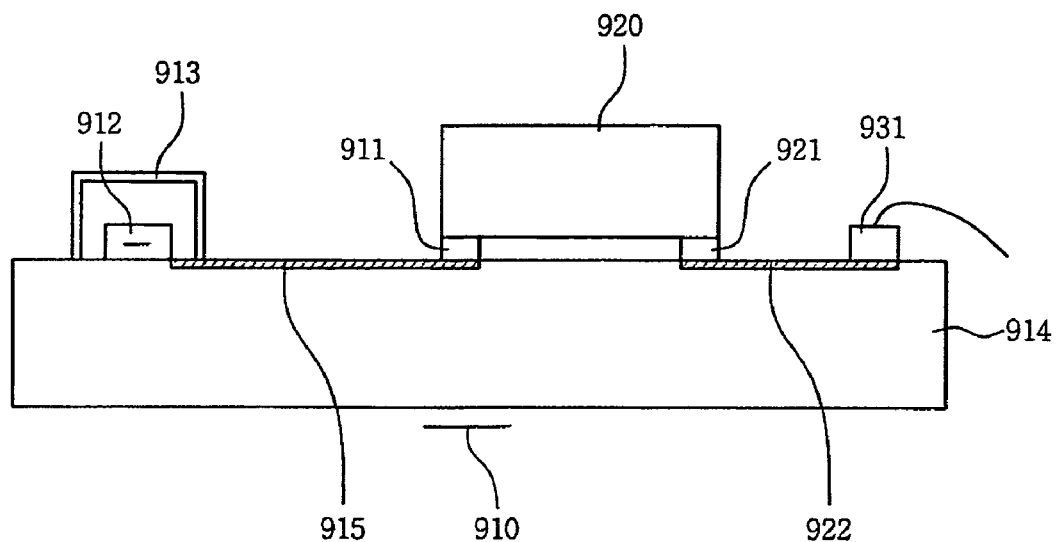
FIG. 9 is a sectional view of an embedded IC packaging structure according to a fifth embodiment of the present invention.

FIG. 9 is a sectional view of an embedded IC packaging structure according to a fifth embodiment of the present invention. In the fifth embodiment, a driver IC is directly bonded to a support substrate of an active IC through a flip-chip bonding process, unlike the first to fourth embodiments.

As shown in FIG. 9, an active element 912 is mounted on the upper surface of the support substrate 914 of the active IC 910, while a glass lid 913 covers and seals the active element 912.

A conductive electrode 915 extends from the active element 912 along the upper surface of the support substrate to the outside of the glass lid 913.

Another conductive electrode 911 is provided on the first side of a lower surface of the driver IC 920 and is bonded through a flip-chip bonding process to the conductive electrode 915 which extends from the active element 912 along the upper surface of the support substrate to the outside of the glass lid 913.

A further conductive electrode 921 is provided on the second side of the lower surface of the driver IC 920 and is bonded through a flip-chip bonding process to yet another conductive electrode 922 which is connected to an outside control circuit through still another conductive electrode 931. Thus, control signals are transmitted from the outside control circuit 931 to the driver IC 920.

Therefore, in response to a control signal transmitted from the outside control circuit, the driver IC 920 generates drive electricity to supply the electricity to the active IC 910.

Figure 10A:
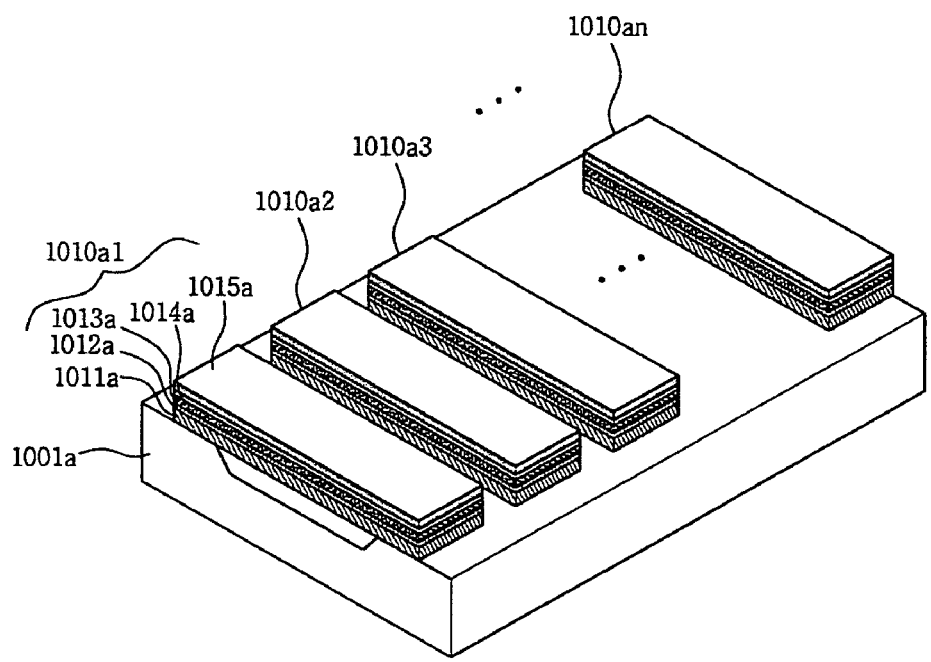
FIGS. 10*a* through 10*c* are perspective views illustrating the construction of active elements included in the embedded IC packaging structures of FIGS. 3, 6, 7, 8 and 9.
Figure 10B:
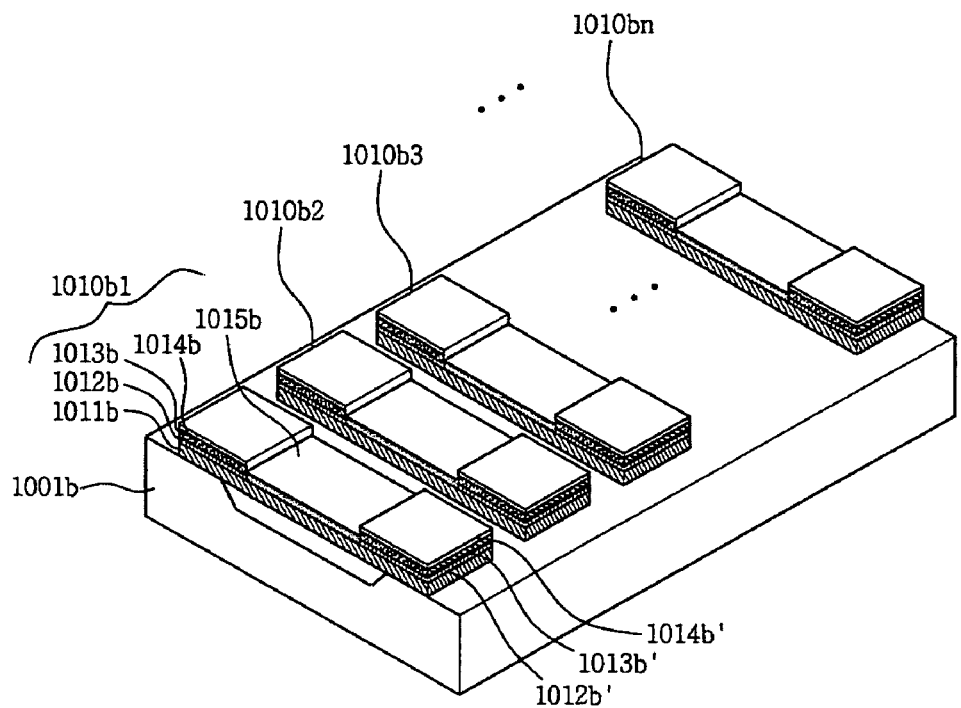
Figure 10C:
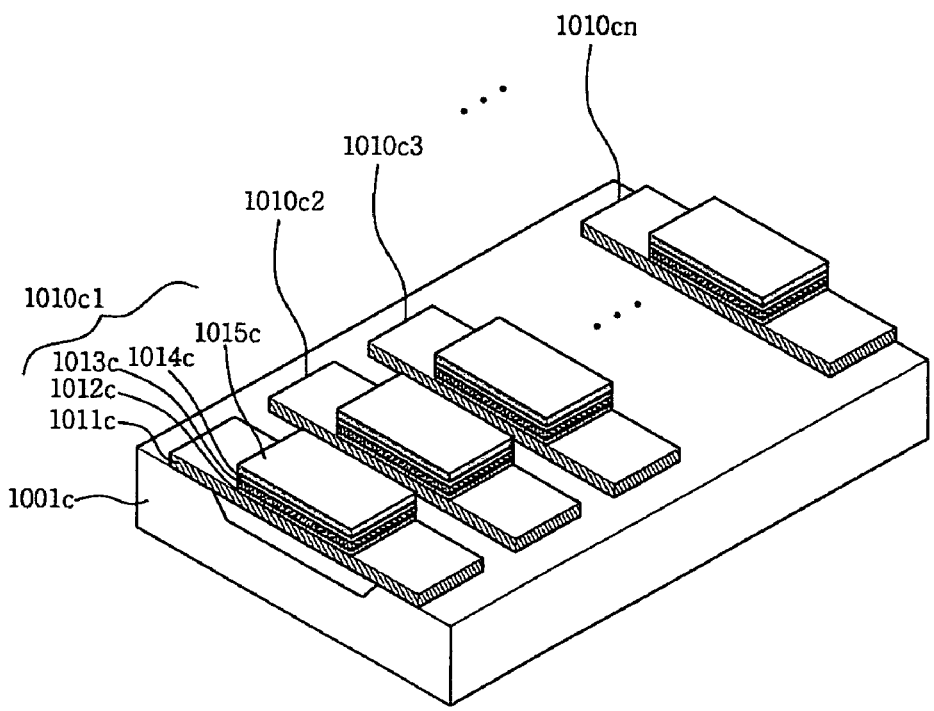

FIGS. 10a through 10c are perspective views illustrating the construction of active elements included in the embedded IC packaging structures of FIGS. 3, 6, 7, 8 and 9.

FIG. 10a is a view of a diffractive thin-film piezoelectric light modulator according to the first embodiment of the present invention. As shown in the drawing, the diffractive thin-film piezoelectric light modulator comprises a silicon substrate 1001a and a plurality of elements 1010a1 to 1010an.

The silicon substrate 1001a has a recess on its upper surface to provide air gaps for the elements 1010a1 to 1010an so that the elements 1010a1 to 1010an are arrayed along the upper surface of the silicon substrate 1001a with both ends of each element mounted to opposite sides of the recess.

The elements 1010a1 to 1010an have a longitudinal plate shape. As both ends of each of the elements are mounted to the upper surface of the substrate 1001a at positions outside the recess, the intermediate portion of each element crosses over the recess. A micromirror layer 1015a is provided on the top of each element, while a lower support layer 1011a which is movable upwards and downwards is provided on the bottom of each element to face the recess of the substrate 1001a.

Each of the elements 1010a1 to 1010an further comprises a lower electrode layer 1012a which is formed on the lower support layer 1011a to supply a piezoelectric voltage; a piezoelectric material layer 1013a which is formed on the lower electrode layer 1012a to contract and expand in response to a voltage applied to both surfaces thereof, thus generating a vertical moving force; an upper electrode layer 1014a which is formed on the piezoelectric material layer 1013a to supply a piezoelectric voltage to the piezoelectric material layer 1013a; and the micromirror layer 1015a formed on the upper electrode layer 1014a to reflect and diffract an incident light beam.

FIG. 10b is a view of a transmissive diffractive thin-film piezoelectric light modulator according to the second embodiment of the present invention. As shown in the drawing, the light modulator of the second embodiment comprises a substrate 1001b and a plurality of elements 1010b1 to 1010bn in the same manner as the first embodiment, but piezoelectric layers are formed on opposite ends of each of the elements, unlike the first embodiment.

The substrate 1001b has a recess on its upper surface to provide air gaps for the elements 1010b1 to 1010bn so that the elements 1010b1 to 1010bn are arrayed along the upper surface of the substrate 1001b with both ends of each element mounted to opposite sides of the recess.

The elements 1010b1 to 1010bn have a longitudinal plate shape. As both ends of each of the elements are mounted to the upper surface of the substrate 1001b at positions outside the recess, the intermediate portion of each element crosses over the recess. A lower support layer 1011b which is movable upwards and downwards is provided on the bottom of each element to face the recess of the substrate 1001b.

Each of the elements 1010b1 to 1010bn further includes a left lower electrode layer 1012b which is formed on the left end of the lower support layer 1011b to supply a piezoelectric voltage; a left piezoelectric material layer 1013b which is formed on the left lower electrode layer 1012b to contract and expand in response to voltages applied to opposite surfaces thereof, thus generating a vertical moving force; and a left upper electrode layer 1014b which is formed on the left piezoelectric material layer 1013b to supply a piezoelectric voltage to the left piezoelectric material layer 1013b.

Each of the elements 1010b1 to 1010bn further includes a right lower electrode layer 1012b' which is formed on the right end of the lower support layer 1011b' to supply a piezoelectric voltage; a right piezoelectric material layer 1013b' which is formed on the right lower electrode layer 1012b' to contract and expand in response to voltages applied to opposite surfaces thereof, thus generating a vertical moving force; and a right upper electrode layer 1014b' which is formed on the right piezoelectric material layer 1013b' to supply a piezoelectric voltage to the right piezoelectric material layer 1013b'.

Furthermore, a micromirror layer 1015b to reflect and diffract an incident light beam is formed on the intermediate portion of the lower support layer 1011b between the left and right ends of the layer 1011b.

FIG. 1c is a view of a transmissive diffractive thin-film piezoelectric light modulator according to the third embodiment of the present invention. As shown in the drawing, the light modulator of the third embodiment comprises a substrate 1001*c* and a plurality of elements 1010*c*1 to 1010*cn* in the same manner as the first and second embodiments, but a piezoelectric layer is formed on only an intermediate portion of each of the elements, unlike the first and second embodiments.

The substrate 1001*c* has a recess on its upper surface to provide air gaps for the elements 1010*c*1 to 1010*cn* so that the elements 1010*c*1 to 1010*cn* are arrayed along the upper surface of the substrate 1001*c* with both ends of each element mounted to opposite sides of the recess.

The elements 1010*c*1 to 1010*cn* have a longitudinal plate shape. As both ends of each of the elements are mounted to the upper surface of the substrate 1001*c* at positions outside the recess, the intermediate portion of each element crosses over the recess. A micromirror layer 1015*c* is formed on only the intermediate portion of each element above the recess by removing the parts of the micromirror layer offset from the recess through an etching process. A lower support layer 1011*c* which is movable upwards and downwards is provided on the bottom of each element to face the recess of the substrate 1001*c*.

Each of the elements 1010*c*1 to 1010*cn* further comprises a lower electrode layer 1012*c* which is formed on the intermediate portion of the lower support layer 1011*c* above the recess to supply a piezoelectric voltage. The parts of the lower electrode layer which are offset from the recess are removed through an etching process. Each element further includes a piezoelectric material layer 1013*c* which is formed on the lower electrode layer 1012*c* to contract and expand in response to voltages applied to opposite surfaces thereof, thus generating a vertical moving force; an upper electrode layer 1014*c* which is formed on the piezoelectric material layer 1013*c* to supply a piezoelectric voltage to the piezoelectric material layer 1013*c*; and a micromirror layer 1015*c* formed on the upper electrode layer 1014*c* to reflect and diffract an incident light beam.

In the preferred embodiments of the present invention, diffractive thin-film piezoelectric light modulators having recesses are embodied as the active elements. However, the active elements may be thin-film piezoelectric light modulators having protrusions, an example of which is referred to in Korean Patent Application No. P2003-077389, entitled "thin-film piezoelectric light modulator and method of producing the same".

In the present invention, a transmissive light modulator, a diffractive light modulator or a reflective light modulator may be used as the light modulator.

As apparent from the above description, the embedded IC packaging structure according to the present invention allows an easy electrical connection between an active IC and outside drivers.

In the present invention, a plurality of conductive electrodes is connected to each other through a single bonding process, thus increasing the process rate while producing the embedded IC packages, increasing the production yield and reducing the production costs of the embedded IC packages.

In addition, the lower surfaces of both the active IC and the driver ICs are in contact with a substrate, thus enhancing the heat dissipation effect of the embedded IC packages.

The present invention enhances the structural stability and structural integrity of the embedded IC packages. Furthermore, as the glass lid is placed on the upper surface of the embedded IC package, the glass lid can be effectively protected from impact even if the package is dropped onto a hard surface.

Another advantage of the present invention is that a soft metal layer may be formed under the active IC, thus making IC devices flat.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An embedded integrated circuit (IC) packaging structure, comprising:
    an active IC mounted to a support substrate, with an active element sealed in the active IC and a first row of conductive electrodes provided on an outer surface of the active IC to supply drive electricity to the active element;
    a driver IC mounted to the support substrate at a position spaced apart from the active IC and generating the drive electricity to drive the active element in response to an outside control signal, with a second row of conductive electrodes provided on an outer surface of the driver IC to supply the drive electricity to the active IC; and
    a secondary substrate provided on opposite sides of a lower surface thereof with a third row of conductive electrodes corresponding to the first row of conductive electrodes and a fourth row of conductive electrodes corresponding to the second row of conductive electrodes, wherein the third row of conductive electrodes is electrically connected to the fourth row of conductive electrodes through an interconnection circuit provided in the secondary substrate, and the third row of conductive electrodes and the fourth row of conductive electrodes are bonded to the first row of conductive electrodes and the second row of conductive electrodes through a flip-chip bonding process, respectively.

2. The embedded IC packaging structure as set forth in claim 1, wherein
    the driver IC comprises a plurality of driver ICs which are arranged to surround the active IC; and
    the secondary substrate has a cavity at a central portion thereof to expose the active element of the active IC to an outside, with the third row of conductive electrodes being arrayed along an inside part of the secondary substrate to be bonded to the first row of conductive electrodes through the flip-chip bonding process and the fourth row of conductive electrodes being arrayed along an outside part of the secondary substrate to be bonded to the second row of conductive electrodes through the flip-chip bonding process.

3. The embedded IC packaging structure as set forth in claim 1, further comprising:
    a soft metal layer formed between the active IC and the support substrate.

4. The embedded IC packaging structure as set forth in claim 1, further comprising:
    a packing material selected from the group consisting of silicon and epoxy, packed in a gap between the active IC and the driver IC to fix the active IC and the driver IC in the packaging structure.

5. An embedded integrated circuit (IC) packaging structure, comprising:
    an active IC mounted to a support substrate, with an active element sealed in the active IC and a first row of conductive electrodes provided on an outer surface of the active IC to supply drive electricity to the active element;

a first secondary substrate mounted to the support substrate at a position spaced apart from the active IC such that an upper surface of the first secondary substrate is leveled with an upper surface of the active IC, the first secondary substrate having a second row of conductive electrodes which is provided on a first side of an outer surface of the first secondary substrate to supply the drive electricity to the active IC and a third row of conductive electrodes which is provided on a second side of the outer surface of the first secondary substrate to receive the drive electricity;

a driver IC mounted to the first secondary substrate and generating the drive electricity to drive the active element in response to an outside control signal, with a fourth row of conductive electrodes provided on an outer surface of the driver IC and bonded to the third row of conductive electrodes so as to supply the drive electricity to the active IC; and a second secondary substrate provided on opposite sides of a lower surface thereof with a fifth row of conductive electrodes corresponding to the first row of conductive electrodes and a sixth row of conductive electrodes corresponding to the second row of conductive electrodes, wherein the fifth row of conductive electrodes is electrically connected to the sixth row of conductive electrodes through an interconnection circuit provided in the second secondary substrate, and the fifth row of conductive electrodes and the sixth row of conductive electrodes are bonded to the first row of conductive electrodes and the second row of conductive electrodes through a flip-chip bonding process, respectively.

6. The embedded IC packaging structure as set forth in claim 5, wherein the third row of conductive electrodes of the first secondary substrate is bonded to the fourth row of conductive electrodes of the driver IC through a flip-chip bonding process.

7. The embedded IC packaging structure as set forth in claim 5, wherein the third row of conductive electrodes of the first secondary substrate is bonded to the fourth row of conductive electrodes of the driver IC through a wire bonding process.

8. The embedded IC packaging structure as set forth in claim 5, wherein
the first secondary substrate comprises a plurality of first secondary substrates which are arranged to surround the active IC;
the driver IC comprises a plurality of driver ICs which are individually mounted to the plurality of first secondary substrates; and
the second secondary substrate has a cavity at a central portion thereof to expose the active element of the active IC to an outside, with the fifth row of conductive electrodes being arrayed along an inside part of the second secondary substrate to be bonded to the first row of conductive electrodes through the flip-chip bonding process and the sixth row of conductive electrodes being arrayed along an outside part of the second secondary substrate to be bonded to the second row of conductive electrodes through the flip-chip bonding process.

9. The embedded IC packaging structure as set forth in claim 5, further comprising:
a soft metal layer formed between the active IC and the support substrate.

10. The embedded IC packaging structure as set forth in claim 5, further comprising:
a packing material selected from the group consisting of silicon and epoxy, packed in a gap between the active IC and the first secondary substrate to fix the active IC and the first secondary substrate in the packaging structure.

11. An embedded integrated circuit (IC) packaging structure, comprising:
an active IC comprising an active element mounted to a first side of an upper surface of a substrate while being sealed by a sealing member, with a first row of conductive electrodes provided on the first side of the upper surface of the substrate to be exposed outside the sealing member and supply drive electricity to the active element and a second row of conductive electrodes provided on a second side of the upper surface of the substrate to receive a control signal from an outside control circuit; and
a driver IC provided on opposite sides of a lower surface thereof with a third row of conductive electrodes and a fourth row of conductive electrodes, wherein the third row of conductive electrodes and the fourth row of conductive electrodes are bonded to the first row of conductive electrodes and the second row of conductive electrodes through a flip-chip bonding process, respectively, and the driver IC generates the drive electricity to drive the active element of the active IC in response to the control signal transmitted from the outside control circuit through both the second row of conductive electrodes and the fourth row of conductive electrodes, and supplies the drive electricity to the active IC through both the third row of conductive electrodes and the first row of conductive electrodes.

* * * * *